United States Patent [19]
Dodds et al.

[11] Patent Number: 5,612,653
[45] Date of Patent: Mar. 18, 1997

[54] LAN STAR CONNECTION USING NEGATIVE IMPEDANCE FOR MATCHING

[75] Inventors: David E. Dodds; Gregory J. Erker, both of Saskatoon, Canada

[73] Assignee: Telecommunications Research Laboratories, Edmonton, Canada

[21] Appl. No.: 480,094

[22] Filed: Jun. 7, 1995

[51] Int. Cl.$^6$ .................................................. H03H 11/28
[52] U.S. Cl. ........................ 333/124; 333/127; 333/216; 379/394
[58] Field of Search ............................... 333/124, 32, 33, 333/216, 217, 125, 127, 213; 379/394, 398, 400, 340, 399, 414, 416; 178/45, 46, 69 R, 69 C

[56] References Cited

U.S. PATENT DOCUMENTS

| 2,777,115 | 1/1957 | Linvill | ........................................ | 333/124 |
| 2,963,558 | 12/1960 | Cerofolini . | | |
| 3,042,759 | 7/1962 | Bonner . | | |
| 3,236,948 | 2/1966 | DeMonte . | | |
| 3,573,647 | 4/1971 | Antoniou | .................................. | 330/69 |
| 3,594,593 | 7/1971 | Ho et al. | ............................. | 333/217 X |
| 3,718,780 | 2/1973 | Oya . | | |
| 3,735,056 | 5/1973 | Martin et al. . | | |
| 3,985,970 | 10/1976 | Lerault et al. . | | |
| 4,056,688 | 11/1977 | Stiefel . | | |
| 4,180,786 | 12/1979 | Forward et al. | .................... | 333/217 X |
| 4,208,641 | 6/1980 | Suzuki | .................................... | 333/217 |
| 4,532,384 | 7/1985 | Keriakos et al. . | | |
| 4,899,382 | 1/1990 | Gartner | ................................... | 379/413 |

FOREIGN PATENT DOCUMENTS

| 979552 | 12/1975 | Canada . |
| WO82/04512 | 6/1982 | WIPO . |

OTHER PUBLICATIONS

McGraw–Hill Dictionary of Scientific and Technical Terms, Fourth Edition, p. 1259. No date.

Primary Examiner—Paul Gensler
Attorney, Agent, or Firm—Davis and Bujold

[57] ABSTRACT

An impedance matched branch connection for local area networks (LANs). A stub or branch connection increases the number of computers that can connect to a LAN. A star connection is formed when several stub lines are connected at the same point. Stub connections introduce an impedance discontinuity in the line and this discontinuity causes signal reflections which interfere with normal data transmission. The impedance discontinuity is avoided by providing a negative impedance device at the star point which makes the impedance at each transmission line appear as though the stub lines were not added.

20 Claims, 2 Drawing Sheets

LAN STAR CONNECTION USING NEGATIVE IMPEDANCE FOR MATCHING

FIELD OF THE INVENTION

This invention relates to the field of computer local area networks. More particularly, this invention relates to the physical topology of LAN wiring in bus connected systems such as Appletalk and Ethernet. The invention specifically relates to stub and star connections of the LAN wiring.

BACKGROUND OF THE INVENTION

Until now, so far as the inventors are aware, most computer networking systems did not allow for stub or star connections in the transmission lines. Users wishing to connect another computer midway along an existing line would have to "stretch" the existing line back and forth to the new computer to avoid having a stub connection. This could mean that excessive cable runs would be necessary to connect the new computer and that the maximum distance limit of the LAN cable may be exceeded.

Some local area networks, such as Appletalk™, do allow for a star connection of up to 4 lines. However, systems with more than 4 computers would also have to run cable back and forth to connect the additional machines along the length of each line.

Ethernet does not allow for any star connections. Even one star connection is enough to plague it with errors and halt the network's activities. A reflection is generated by the line impedance discontinuity occurring at the star connection point and this returns part of the transmitted information to the sending computer. This erroneous information will cause the system to fail.

Ethernet also uses the average dc voltage on the coaxial line to determine if a collision has occurred. If the stub is terminated with a resistance, the average dc level will change due to the increased loading. This will cause the collision detection to fail. It should also be noted that dc power cannot be transmitted down an Ethernet line for use by any circuits connected to the line. Therefore, any circuit connected to the line would have to be connected to its own external power supply which would render it sensitive to local power outages.

An active device based on logic circuits may be used in a LAN to provide the function of a star connection. In Appletalk™ networks, active hubs may be used when more than 4 devices must be connected in a star configuration. Commercially available active hubs may have 12 or 24 ports and will take data received on one port, regenerate the waveform for signal levels, then output it to all the other ports. This regeneration solves the signal distortion problem caused by passively starring lines together, however, there is considerable cost associated with the required circuitry.

In a similar application, Ethernet networks using twisted pair wiring (10BaseT) must use active hubs to connect devices together. The 10BaseT specification does not allow any wires to be starred together. The active hub works like Appletalk hub in that it receives a signal on one port, recovers the data from the signal, and outputs a regenerated signal on all ports.

A star connection also exists in voice telephony systems and is known as a conference circuit. Active conference circuits based on logic circuits are commonplace in the modern digital network. Conference circuits can also be formed on analog subscriber lines with branch connection of extension line stations within a residence. It should be noted that only a narrow band of frequencies is required for voice communication and that reflections caused by the discontinuity at the branch connection are tolerated by the users.

SUMMARY OF THE INVENTION

In the illustrated embodiment of the invention, a negative impedance is placed at the stub T connection to cancel out the additional impedance load of the stub line. This allows a signal travelling from any direction to see its exact line matching impedance at the T and pass though without distortion, attenuation or reflection. This negative impedance allows stations on any two branches of the T to communicate with each other. The silent branch also receives the full signal levels so that broadcast messages will still work properly.

More than one line may be connected at each T connection thus forming a star connection. By varying the negative impedance, an exact match can be realized for any number of connected lines. The matched star connection uses negative impedance to effectively cancel the impedance of the additional lines connected at the star point.

Thus, in one embodiment of the invention, there is provided a branched transmission line for a local area network, the branched transmission line comprising:

at least three transmission lines meeting at a junction; and a negative impedance device connected to the junction, the negative impedance device having a characteristic impedance selected so that each transmission line encounters a matched impedance at the junction.

The negative impedance device preferably includes an operational amplifier and a network of discrete components to obtain a negative impedance which approximates the stub line impedance. The operational amplifier provides operation over a wide bandwidth. An element $Z_F$ is provided in the feedback circuit of the operational amplifier. The element $Z_F$ can be composed of several branches in order to approximate the line characteristic impedance over a wide frequency range. With the coaxial cable, only a resistor is necessary for $Z_F$ while for twisted pair wiring, an RC network is required since the characteristic impedance of twisted pair wire is complex in the frequency range of interest.

In the event of a power interruption to the negative impedance device, an isolator switch is provided to remove the negative impedance and branch from the main LAN line to prevent any distortion or reflection on the remaining system. This reduces the number of users affected by the power outage.

In a further embodiment of the invention, there is provided a method of connecting a stub transmission line to an existing transmission line in a local area network, the method comprising:

forming a junction between the stub transmission line and the existing transmission line; and connecting a negative impedance device to the stub transmission line at the junction, the negative impedance device having an impedance equal in magnitude to the characteristic impedance of the stub transmission line so that signals approaching the junction from either direction of the existing line do not encounter a significant impedance discontinuity at the junction. In this context, significant impedance discontinuity means a discontinuity that will cause a substantial signal reflection that would cause LAN failure.

BRIEF DESCRIPTION OF THE DRAWINGS

There will now be described preferred embodiments of the invention, with reference to the drawings, by way of illustration, in which like numerals denote like elements and in which.

DETAILED DESCRIPTION OF PREFERRED EMBODIMENTS

Figure 1:
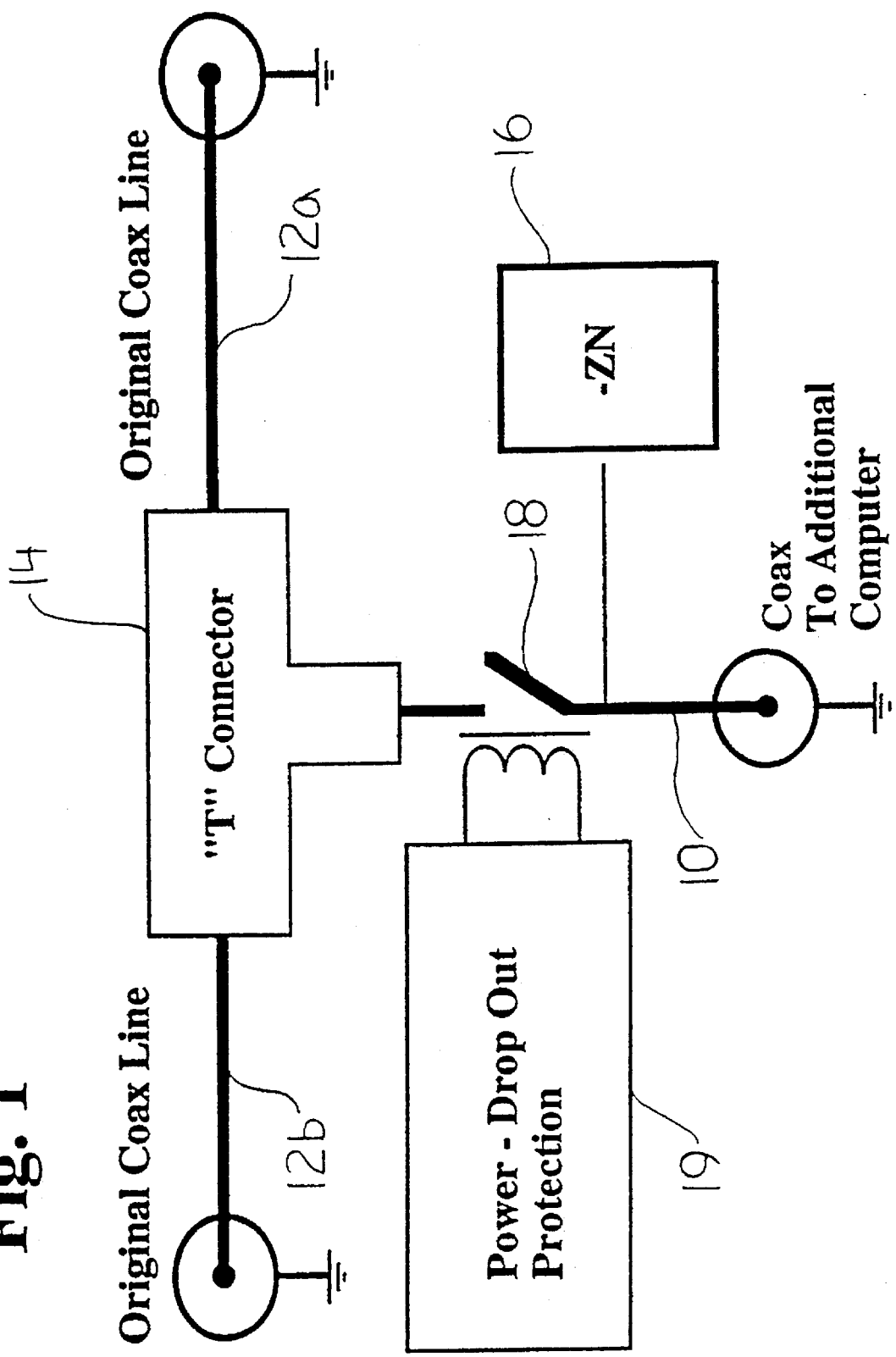
FIG. 1 is a schematic showing an existing transmission line with stub connection and negative impedance device according to the invention.

Referring to FIG. 1, a single stub transmission line 10 is shown connected to an existing transmission line formed of lines 12a, 12b at a junction 14 with negative impedance device 16 connected to the stub transmission line 10. The stub transmission line 10 and existing transmission line 12a, 12b together form a branched transmission line meeting at the junction 14. As used in this patent document, a negative impedance device is any electrical circuit that produces a negative impedance on a line to which it is connected. The impedance of the negative impedance device 16 is selected to cancel the effect of the parallel stub impedance and therefore match the impedances of each transmission line meeting at the junction 14. The junction 14 is preferably formed of a commercial BNC branch T connector which provides three connections to coaxial cable. Ethernet '10B2' cable has similar commercially available attachments which may also be used.

An isolating switch 18 with switch control 19, shown in FIG. 1, is used to disconnect the negative impedance device 16 should the negative impedance device fail, such as by failure of its power supply. The negative impedance device 16 must also be removed from the original line in the event that the termination impedance at the stub computer is removed or otherwise altered. The switch control 19 forms a means responsive to either the failure of the negative impedance device or a significant change in impedance on the stub transmission line 10 to disconnect the negative impedance device 16 and the stub transmission line 10 from the existing transmission line 12a, 12b. A significant change in impedance would normally occur as a result of removal of the termination impedance of a computer on the stub transmission line. Failure to provide such a switch control 19 in case of failure of the stub transmission line 10 or the negative impedance device 16 will result in impedance discontinuity and LAN failure due to reflections. The switch control 19 is in itself made according to known principles of construction and does not need to be further described here.

Figure 2:
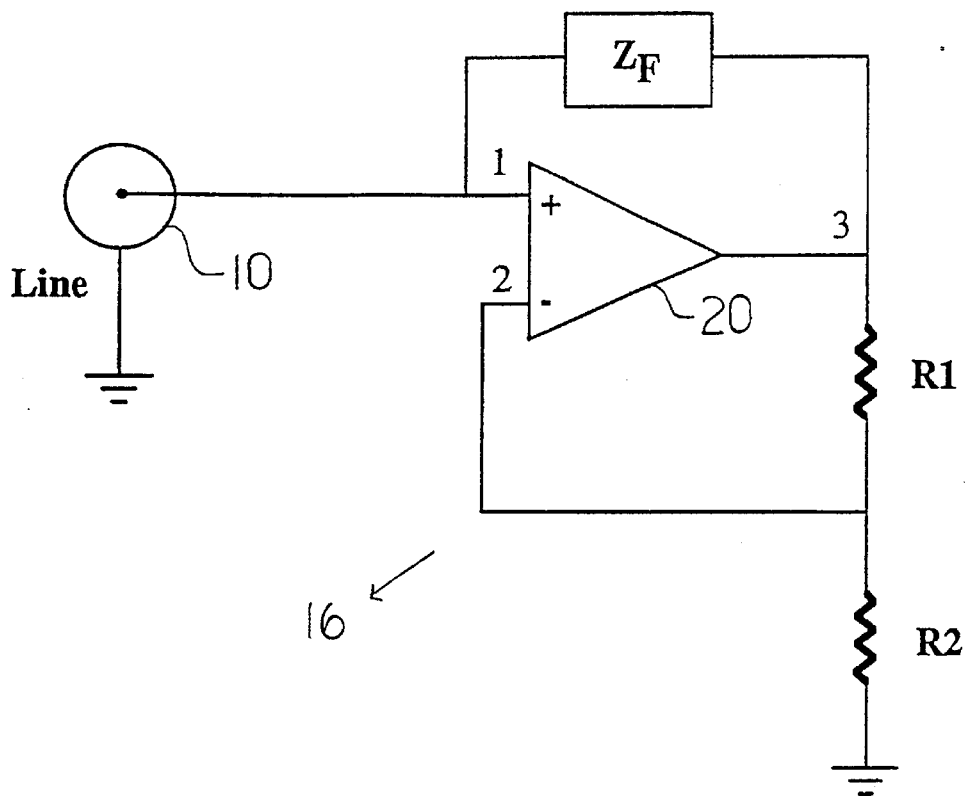
FIG. 2 is a circuit diagram of a negative impedance device for use with a branched transmission line according to the invention.

Referring to FIG. 2, an operational amplifier 20 is used to form a negative impedance device. The positive node of the operational amplifier, seen as point 1 in FIG. 2, is connected to the stub transmission line 10. The negative node 2 of the operational amplifier is connected to a voltage divider formed by $R_1$ and $R_2$ between the output 3 of the operational amplifier and ground. During operation, the operational amplifier 20 keeps the voltage across its terminals 1, 2 approximately equal. As the voltage rises at the input (point 1), the amplifier increases the voltage at its output (point 3) so that the voltage at point 2 is equal to the voltage at point 1. For example, if $R_1=R_2$, the voltage at point 3 must be twice the voltage at point 1. This will create a voltage across $Z_f$ with point 3 being at a higher voltage then point 1. The current must flow from greater potential to lesser potential and thus the current will flow out into the line which is the opposite direction when compared to a positive load resistance connected to ground. The circuit thus emulates a negative resistance with value $-Z_F$. In the case when $R_1=K*R_2$, the negative resistance $Z_N$, is given by: $Z_N=-Z_F/K$.

The simple case of only one T connection will be considered first. If the network lines 10, 12a, 12b have a characteristic impedance of 50 ohms, then when a split is made, each side will see two other cables in parallel. The two cables in parallel appear as a 25 ohm termination at the junction point. With the addition of the −50 ohm parallel load from the negative impedance device 16, the junction point impedance increases to 50 ohms and all transmitting cables 10, 12a, 12b see a matched 50 ohm impedance at the junction point. Because the negative impedance network is bi-directional, each of the three lines 10, 12a, 12b will see only the 50 ohms and will receive and transmit as if there was no T connection.

A stub transmission line 10 can therefore be retrofitted to an existing transmission line 12a, 12b by forming a T junction and connecting a negative impedance device to the stub transmission line 10 at the junction 14.

The number of parallel lines added can be increased as long as the negative impedance is adjusted to compensate for the additional connections.

Figure 3:
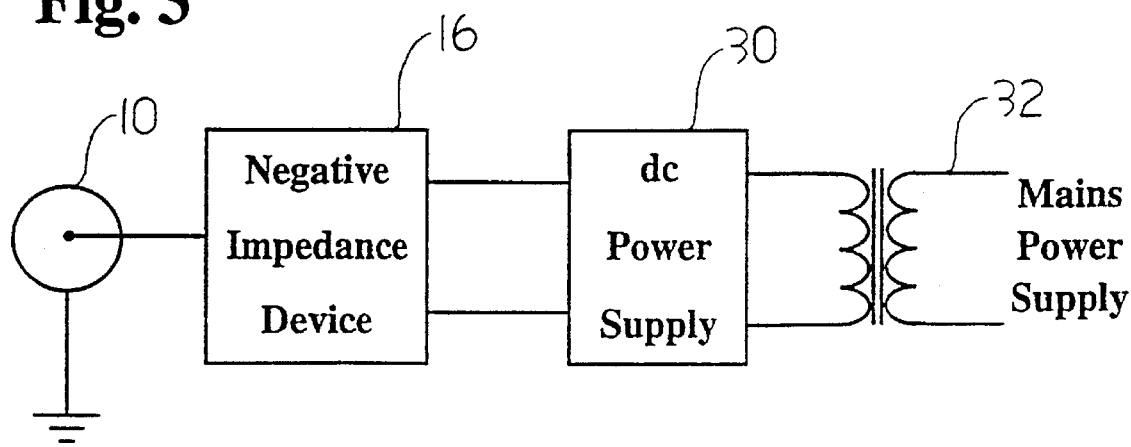
FIG. 3 is a schematic showing the power supply for the negative impedance device of FIG. 2.

In an Ethernet based environment, the operational amplifier 20 must also be able to supply the current necessary to maintain the dc balance on the line. A collision detection unit on each LAN interface checks the dc voltage on the line to determine if the data sent by the computer was interfered with by another machine. The amplifier 20 also compensates for the dc loading of the termination in the third branch and hence does not interfere with the collision detection process. Since the negative impedance device must be dc coupled to the junction point, transformer isolation cannot be provided at the LAN side of the negative impedance device 16. Transformer isolation must be provided on the power supply as illustrated in FIG. 3. A DC power supply 30 is connected to the negative impedance device 16, and the DC power supply is also connected to a main AC power supply through a transformer 32.

Low characteristic impedance of the lines 10, 12a, 12b means that high output drive capability is required in the operational amplifier 20. Commercial devices such as the Analog Devices AD844 operational amplifier 20 are believed to be capable of driving 50 ohm load impedances.

A person skilled in the art could make immaterial modifications to the invention described and claimed in this patent without departing from the essence of the invention.

The embodiments of the invention in which an exclusive property or privilege is claimed are defined as follows:

1. A branched transmission line for a local area network, the branched transmission line comprising:
   at least three transmission lines meeting in parallel at a junction; and
   a negative impedance device being connected to the junction in parallel with the transmission lines, and the negative impedance device having a characteristic impedance so that signals approaching the junction on each transmission line encounter a matched impedance at the junction.

2. The branched transmission line of claim 1 in which the negative impedance device has a complex negative impedance.

3. The branched transmission line of claim 2 further including means to disconnect the negative impedance device and at least one of the transmission lines in case of failure of the negative impedance device or change in impedance of one of the transmission lines.

4. The branched transmission line of claim 3 in which the negative impedance device has a grounded AC power supply and further comprising a transformer connected between the AC power supply and the negative impedance device to isolate the transmission line from the grounded AC power supply.

5. The branched transmission line of claim 1 in which one of the transmission lines is a stub transmission line, the other transmission lines being existing transmission lines, and further including means to disconnect the negative impedance device and the stub transmission line from the existing transmission lines in case of failure of the negative impedance device or change in impedance of the stub transmission line.

6. The branched transmission line of claim 5 in which the negative impedance device has a complex negative impedance.

7. The branched transmission line of claim 6 in which the negative impedance device has a grounded AC power supply and further comprising a transformer connected between the AC power supply and the negative impedance device to isolate the transmission line from the grounded AC power supply.

8. The branched transmission line of claim 1 in which the negative impedance device has a grounded AC power supply and further comprising a transformer connected between the AC power supply and the negative impedance device to isolate the transmission line from the grounded AC power supply.

9. A method of connecting a stub transmission line to an existing transmission line in a local area network, the method comprising:

forming a junction between the stub transmission line and the existing transmission line; and connecting a negative impedance device on the stub transmission line to the junction, the negative impedance device having an impedance equal in magnitude to the characteristic impedance of the stub transmission line so that signals approaching the junction from either direction on the existing line encounter a matched impedance at the junction.

10. The method of claim 9 further including:

disconnecting the negative impedance device and the stub transmission line from the existing transmission line in case of failure of the negative impedance device or change in impedance on the stub transmission line.

11. The method of claim 10 further including connecting the negative impedance device to a grounded AC power supply through a transformer to isolate the transmission line from the grounded AC power supply.

12. The method of claim 9 further including connecting the negative impedance device to a grounded AC power supply through a transformer to isolate the transmission line from the grounded AC power supply.

13. A branched transmission line for a local area network, the branched transmission line comprising:

at least three transmission lines meeting in parallel at a junction, each transmission line having similar characteristic impedance; and a negative impedance device being connected to the junction in parallel with the transmission lines, and the negative impedance device having an impedance so that signals approaching the Junction on any of the transmission lines encounter an equivalent impedance substantially the same as the characteristic impedance of a single transmission line.

14. The branched transmission line of claim 13 in which the negative impedance device has a complex negative impedance.

15. The branched transmission line of claim 14 further including means to disconnect the negative impedance device and at least one of the transmission lines in case of one of failure of the negative impedance device and change in impedance of one of the transmission lines.

16. The branched transmission line of claim 15 in which the negative impedance device has a grounded AC power supply and further comprising a transformer connected between the AC power supply and the negative impedance device to isolate the transmission line from the grounded power supply.

17. The branched transmission line of claim 13 in which one of the transmission lines is a stub transmission line, the other transmission lines being existing transmission lines, and further including means to disconnect the negative impedance device and the stub transmission line from the existing transmission lines in case of one of failure of the negative impedance device and change in impedance of the stub transmission line.

18. The branched transmission line of claim 17 in which the negative impedance device has a complex negative impedance.

19. The branched transmission line of claim 18 in which the negative impedance device has a grounded AC power supply and further comprising a transformer connected between the AC power supply and the negative impedance device to isolate the transmission line from the grounded power supply.

20. The branched transmission line of claim 13 in which the negative impedance device has a grounded AC power supply and further comprising a transformer connected between the AC power supply and the negative impedance device to isolate the transmission line from the grounded power supply.

* * * * *